United States Patent
Han et al.

(10) Patent No.: US 8,994,618 B2
(45) Date of Patent: Mar. 31, 2015

(54) DISPLAY DEVICE AND OPERATING METHOD THEREOF

(75) Inventors: Sangmyeon Han, Seoul (KR); Jonghwa Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 561 days.

(21) Appl. No.: 13/177,374

(22) Filed: Jul. 6, 2011

(65) Prior Publication Data

US 2012/0206049 A1 Aug. 16, 2012

(30) Foreign Application Priority Data

Feb. 11, 2011 (KR) ........................ 10-2011-0012558

(51) Int. Cl.
- *G09G 3/30* (2006.01)
- *G09G 3/36* (2006.01)
- *H01L 27/32* (2006.01)

(52) U.S. Cl.
CPC ........ *H01L 27/3269* (2013.01); *H01L 27/3211* (2013.01)
USPC .................................. 345/76; 345/87; 345/88

(58) Field of Classification Search
USPC .......................................................... 345/76
See application file for complete search history.

(56) References Cited

U.S. PATENT DOCUMENTS

| | | |
|---|---|---|
| 6,005,990 A | 12/1999 | Barrett et al. |
| 2007/0109239 A1* | 5/2007 | den Boer et al. ................ 345/87 |
| 2008/0158120 A1* | 7/2008 | An et al. ......................... 345/88 |
| 2008/0191979 A1* | 8/2008 | Nakane et al. ................. 345/87 |
| 2009/0002336 A1* | 1/2009 | Choi et al. .................... 345/174 |
| 2010/0156780 A1* | 6/2010 | Jacobson et al. ............. 345/107 |

FOREIGN PATENT DOCUMENTS

| | | |
|---|---|---|
| JP | 10-150525 | 6/1998 |
| KR | 10-2008-0096131 A | 10/2008 |
| KR | 10-2009-0058888 A | 6/2009 |
| KR | 10-2009-0124340 A | 12/2009 |

* cited by examiner

*Primary Examiner* — Charles V Hicks

(74) *Attorney, Agent, or Firm* — Christie, Parker & Hale, LLP

(57) ABSTRACT

Provided are a display device and an operating method thereof. The display device includes a display panel which includes a plurality of first, second, and third display pixels and a plurality of unit cells. The first, second, and third display pixels include a plurality of organic light emitting materials for displaying first, second, and third colors, respectively. Each of the unit cells includes one light sensing pixel adjacent to the first, second, and third display pixels.

19 Claims, 20 Drawing Sheets

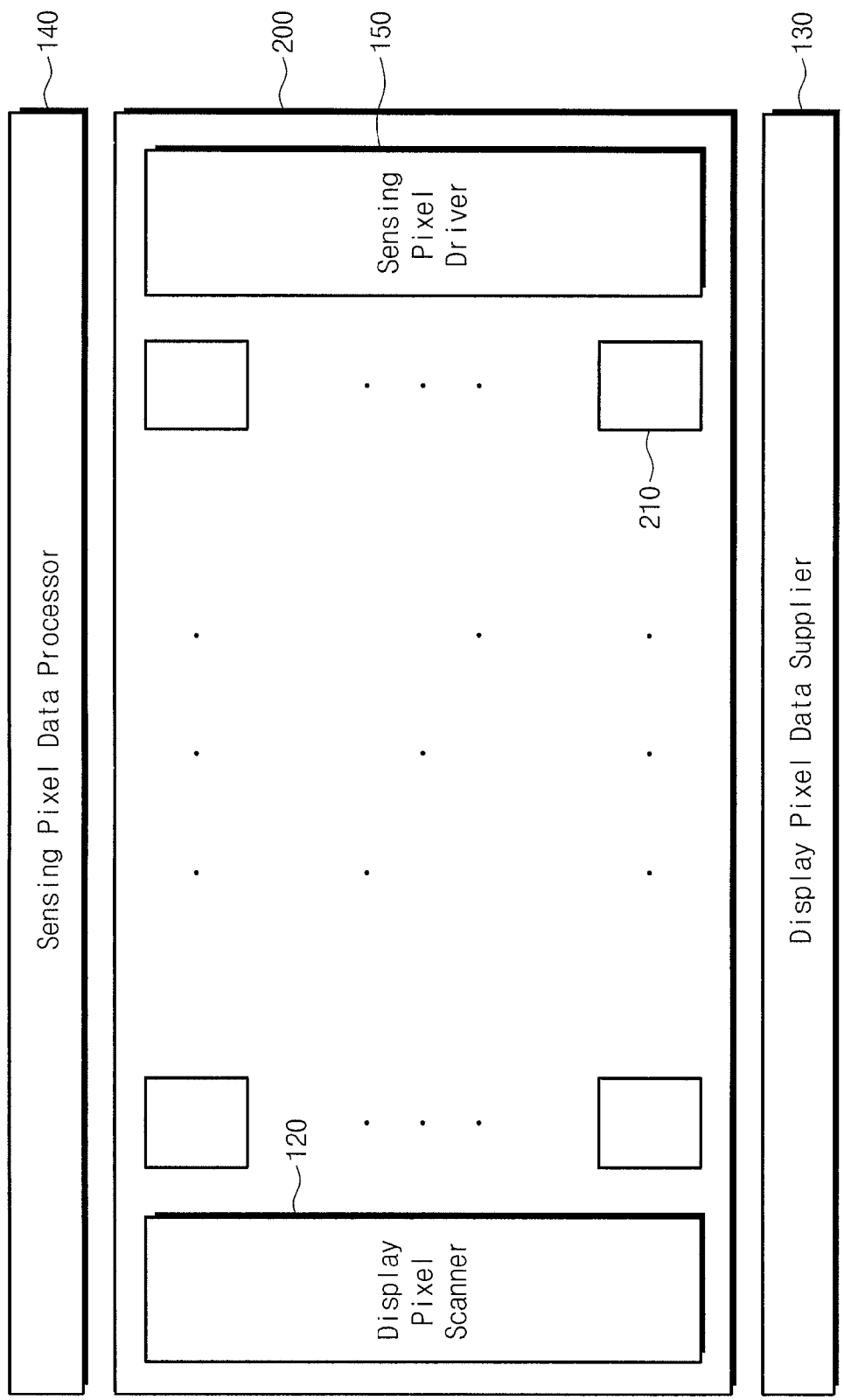

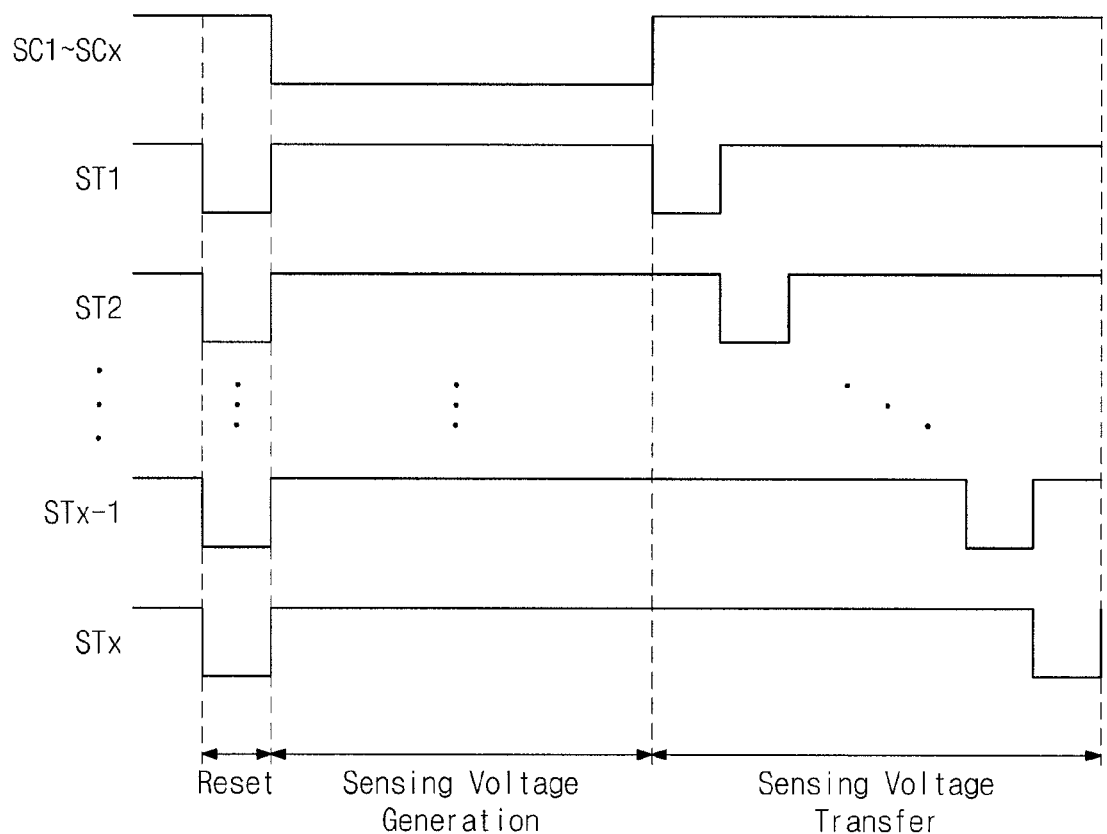

DISPLAY DEVICE AND OPERATING METHOD THEREOF

CROSS-REFERENCE TO RELATED APPLICATIONS

This U.S. non-provisional patent application claims priority under 35 U.S.C. §119 of Korean Patent Application No. 10-2011-0012558, filed on Feb. 11, 2011, the entire contents of which are hereby incorporated by reference.

BACKGROUND

1. Field

The present disclosure herein relates to a display device and an operating method thereof.

2. Description of Related Art

Recently, display devices such as monitors and televisions are being made lighter and thinner. As a type of display device that has such characteristics, organic light emitting diode (OLED) displays are attracting much attention. Each pixel in OLED displays includes two electrodes, and an emission layer disposed therebetween. In OLED displays, electrons injected from one of the two electrodes and holes injected from the other electrode are combined in the emission layer to form excitons. The excitons release energy to emit light. One of the electrodes is coupled to a thin film transistor for controlling light emission in the emission layer.

SUMMARY

An aspect of embodiments according to the present invention is to provide a display device having high reliability and an operating method thereof.

Another aspect of embodiments according to the present invention is to provide a display device and an operating method thereof, which perform a display function and a scan function.

Another aspect of embodiments according to the present invention is to provide a display device having a high aperture ratio and an operating method thereof.

Embodiments of the present invention provide a display device including: a display panel including a plurality of unit cells, wherein each of the unit cells includes: a first display pixel including an organic light emitting material for displaying a first color; a second display pixel including an organic light emitting material for displaying a second color; a third display pixel including an organic light emitting material for displaying a third color; and a light sensing pixel adjacent to the first, second, and third display pixels.

In some embodiments, the first, second, and third display pixels may be provided in plurality, respectively.

In other embodiments, the light sensing pixel may be extended in a first direction, and the first display pixels, the second display pixels, and the third display pixels may be arranged in the first direction, respectively.

In still other embodiments, the first, second, and third display pixels extended in the first direction may configure a display pixel group, the display pixel group may be provided in plurality, and the display pixel groups may be arranged at both sides of the light sensing pixel.

In still other embodiments, the light sensing pixel may be extended in a first direction, and the first display pixel, the second display pixel, and the third display pixel may be arranged in the first direction.

In yet other embodiments, the first, second, and third display pixels extended in the first direction may configure a display pixel group, the display pixel group may be provided in plurality, and the display pixel groups may be arranged at both sides of the light sensing pixel.

In further embodiments, one of the first, second, and third display pixels may be larger than the other display pixels.

In still further embodiments, the one of the display pixels that is larger than the other display pixels, may display blue.

In still further embodiments, the light sensing pixel may be surrounded by the first, second, and third display pixels.

In yet further embodiments, the light sensing pixel may include an optic-electro converter.

In other embodiments of the present invention, an operating method of a display device includes: emitting a first color light from a first display pixel of the display device comprising a plurality of unit cells. Each of the unit cells includes the first display pixel, a second display pixel, and a third display pixel which include organic light emitting materials for emitting the first color light, a second color light, and a third color light, respectively; and sensing the first color light with the light sensing pixel.

In some embodiments, the operating method may further include: emitting the second color light from the second display pixel, after sensing the first color light; sensing the second color light with the light sensing pixel; emitting the third color light from the third display pixel, after sensing the second color light; and sensing the third color light with the light sensing pixel.

In other embodiments, the operating method may further include displaying the sensed first, second, and third color lights on the first, second and third display pixels, respectively, after sensing the third color light.

In still other embodiments, the second and third display pixels may not emit the second and third color lights while the first display pixel is emitting the first color light.

In still other embodiments, the operating method may further include arranging a scanning object on the display device before emitting of the first display pixel, wherein the sensing of the first color light may include sensing a light reflected from the scanning object.

In yet other embodiments, the display device may further include a sensing data processor coupled to the light sensing pixel, the light sensing pixel may include an optic-electro converter, and the sensing the reflected light may include: generating a sensing voltage by the reflected light being inputted to the optic-electro converter; and transferring the sensing voltage to the sensing data processor.

In further embodiments, the first display pixel may not emit the first color light while the sensing voltage is being transferred to the sensing data processor.

In still further embodiments, the second and third display pixels may emit the second and third color lights while the first display pixel is emitting light.

In still further embodiments, the light sensing pixel may sense the first, second, and third color lights.

BRIEF DESCRIPTION OF THE DRAWINGS

The accompanying drawings are included to provide a further understanding of embodiments according to the present invention, and are incorporated in and constitute a part of this application. The drawings illustrate exemplary embodiments of the present invention and, together with the description, serve to explain principles of present invention. In the drawings:

FIGS. 2A and 2B are diagrams illustrating a display device according to a modification example of an embodiment of the present invention;

FIG. 5B is a timing diagram exemplarily showing operating methods of light sensing pixels according to a first embodiment of the present invention;

DETAILED DESCRIPTION OF THE EMBODIMENTS

Figure 1:
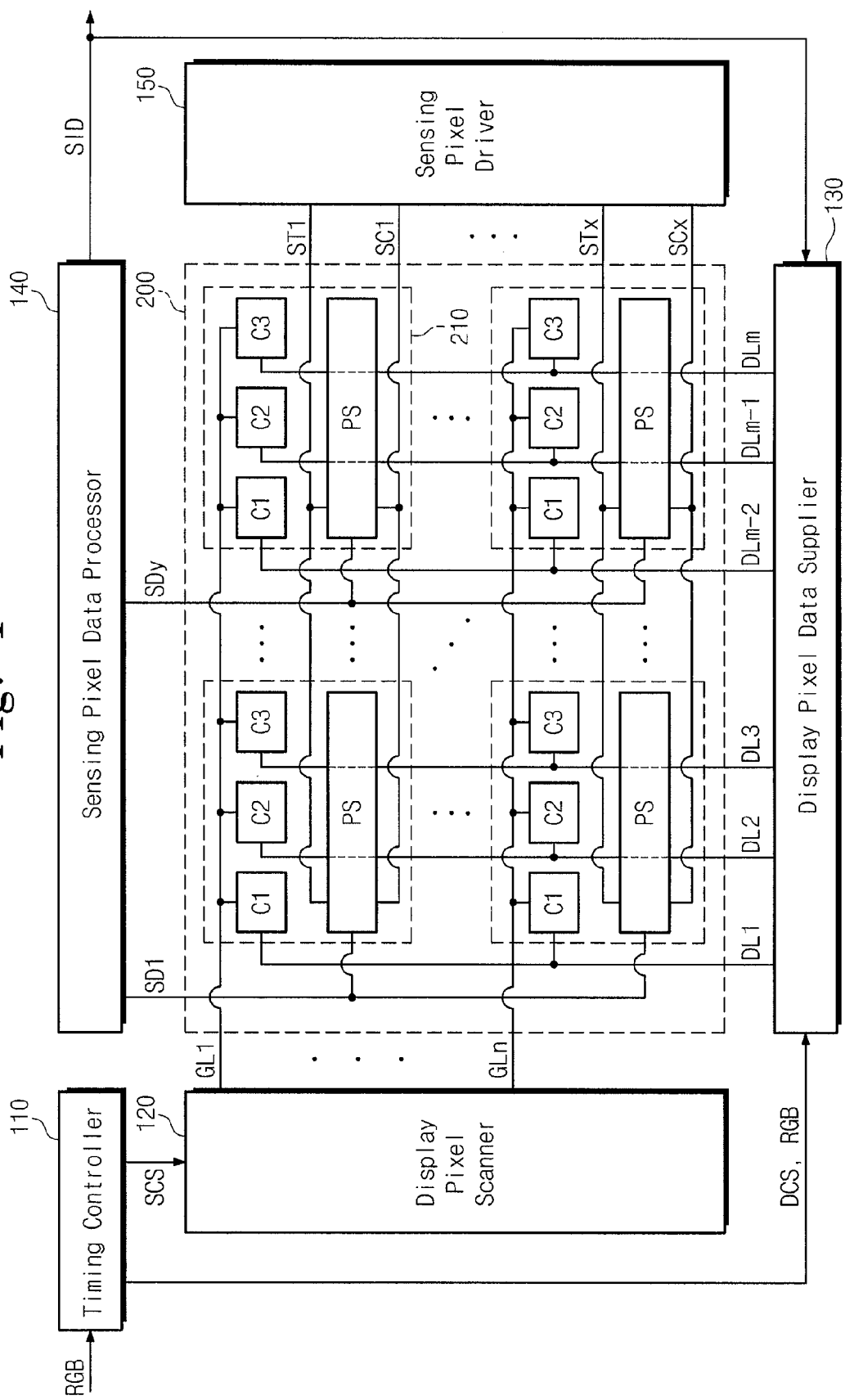
FIG. 1 is a block diagram illustrating a display device according to an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

An embodiment described and exemplified herein includes a complementary embodiment thereof. In the specification, the term 'and/or' is used as meaning in which the term includes at least one of preceding and succeeding elements. Like reference numerals refer to like elements throughout. When a first element is described as being "coupled" or "connected" to a second element, the first element may be directly connected (or directly electrically connected) to the second element, or may be indirectly coupled or electrically coupled to the second element with one or more elements located therebetween.

A display device according to an embodiment of the present invention will be described below.

FIG. 1 is a block diagram illustrating a display device according to an embodiment of the present invention.

Referring to FIG. 1, a display device according to an embodiment of the present invention includes a timing controller 110, a display pixel scanner 120, a display pixel data supplier 130, a sensing pixel data processor 140, a sensing pixel driver 150, and a display panel 200.

The display panel 200 may include a plurality of unit cells 210. Each of the unit cells 210 includes display pixels C1 to C3, and a light sensing pixel PS. The unit cells 210 may be arranged in a matrix format in a first direction and a second direction perpendicular to the first direction.

The display panel 200 may include a plurality of gate lines GL1 to GLn that are extended in the first direction, and a plurality of data lines DL1 to DLm that are extended in the second direction. The second direction may perpendicularly intersect the first direction. Each of the display pixels C1 to C3 may be coupled to one gate line and one data line.

The first to third display pixels C1 to C3 may include organic light emitting materials for displaying first to third colors, respectively. Each of the first to third colors may be any one of red, green, and blue. In other embodiments, each of the first to third colors may be any one of cyan, magenta, and yellow.

The display panel 200 includes a plurality of sensing voltage generation control lines SC1 to SCx that are extended in the first direction, and a plurality of sensing voltage transfer control lines ST1 to STx that are also extended in the first direction. The display panel 200 also includes a plurality of sensing data lines SD1 to SDy that are extended in the second direction. The light sensing pixel PS is coupled to one sensing voltage generation control line, one sensing voltage transfer control line, and one sensing data line. The light sensing pixels PS included in the unit cells 210 may include an optic-electro converter. Therefore, light inputted to the optic-electro converter may be converted into a sensing voltage.

The timing controller 110 may generate a scan control signal SCS and a data control signal DCS. The timing controller 110 may transfer the scan control signal SCS to the display pixel scanner 120, and may transfer the data control signal DCS to the display pixel data supplier 130. The timing controller 110 may receive pixel data signals RGB and may transfer the received signals RGB to the display pixel data supplier 130.

The display pixel scanner 120 may receive the scan control signal SCS, select one gate line from among the gate lines GL1 to GLn, and apply a gate voltage to the selected gate line. The gate voltage may be applied to the display pixels C1 to C3. The display pixel scanner 120 may control timing of the gate voltage that is supplied to the gate lines GL1 to GLn in response to the scan control signal SCS.

For example, the display pixel scanner 120 may sequentially apply the gate voltage from the first gate line GL1 to the nth gate line GLn. Switching transistors that are respectively included in display pixels C1 to C3 coupled to the selected gate line receiving the gate voltage, may be turned on, but switching transistors that are respectively included in display pixels C1 to C3 coupled to unselected gate lines receiving no gate voltage, may be turned off. Switching transistors that are respectively included in display pixels C1 to C3 coupled to the same gate line may be concurrently (e.g., simultaneously) turned on/off.

The display pixel data supplier 130 may receive the pixel data signals RGB and the data control signal DCS. The display pixel data supplier 130 may convert the pixel data signals RGB into analog voltages to supply data output voltages to the data lines DL1 to DLm. The data output voltages may be respectively supplied to the display pixels C1 to C3, which may emit light.

The sensing pixel driver 150 may transfer signals to the light sensing pixels PS through the sensing voltage transfer control lines ST1 to STx and the sensing voltage generation control lines SC1 to SCx, and drive the light sensing pixels PS to generate sensing voltages, respectively. The sensing pixel data processor 140 may receive the sensing voltages through the sensing data lines SD1 to SDy, respectively. When the display device according to an embodiment of the present invention performs a scanning operation, each of the sensing voltages may include a scanned image data SID. The sensing pixel data processor 140 may transfer the scanned image data SID to the outside or the display pixel data supplier 130.

At least one of: the display pixel scanner 120 and display pixel data supplier 130 coupled to the display pixels C1 to C3; or the sensing pixel data processor 140 and sensing pixel driver 150 coupled to the light sensing pixels PS, may be integrated in the display panel. This will be described below with reference to FIGS. 2A and 2B.

Figure 2B:
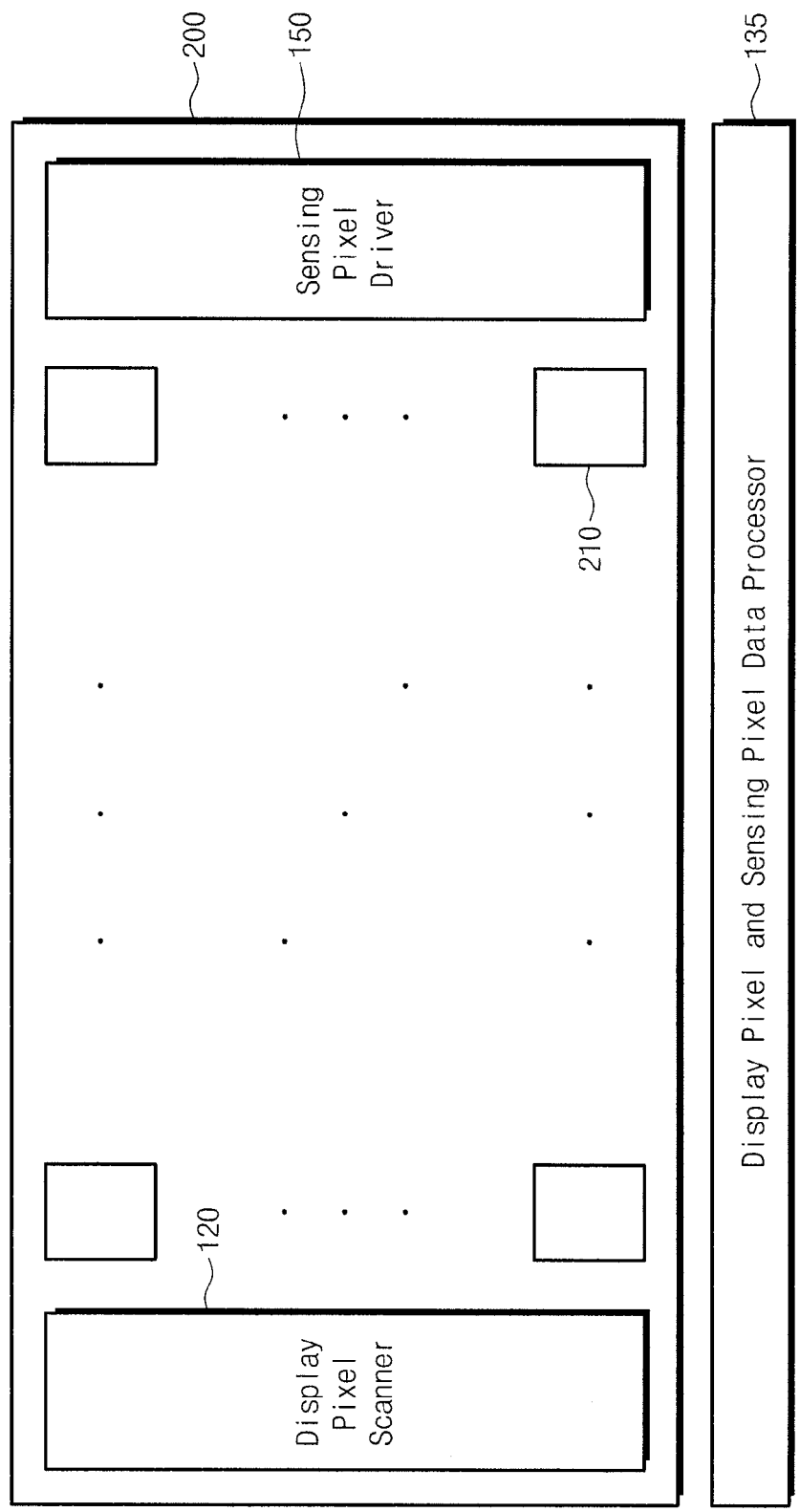

FIGS. 2A and 2B are diagrams illustrating a display device according to a modification example of an embodiment of the present invention.

Referring to FIG. 2A, the display pixel scanner 120 coupled to the display pixels C1 to C3 and the sensing pixel driver 150 coupled to the light sensing pixels PS may be built into the display panel 200. For example, the display pixel scanner 120 and the sensing pixel driver 150 may be mounted on the display panel 200 in a Chip On Glass (COG) type. The display pixel scanner 120 may be located at one side of the unit cells 210, and the sensing pixel driver 150 may be located at another side of the unit cells 210.

Referring to FIG. 2B, as described above with reference to FIG. 2A, the display pixel scanner 120 and the sensing pixel driver 150 may be built into the display panel 200. Furthermore, the display panel 200 may internally include a display pixel and sensing pixel data processor 135 that concurrently (e.g., simultaneously) performs functions of the display pixel data supplier 130 and sensing pixel data processor 140 that have been described above with reference to FIG. 1.

As described above, the first to third display pixels C1 to C3 of the display panel 200 in FIG. 1 may include organic light emitting materials. This will be described below with reference to FIG. 3.

Figure 3:
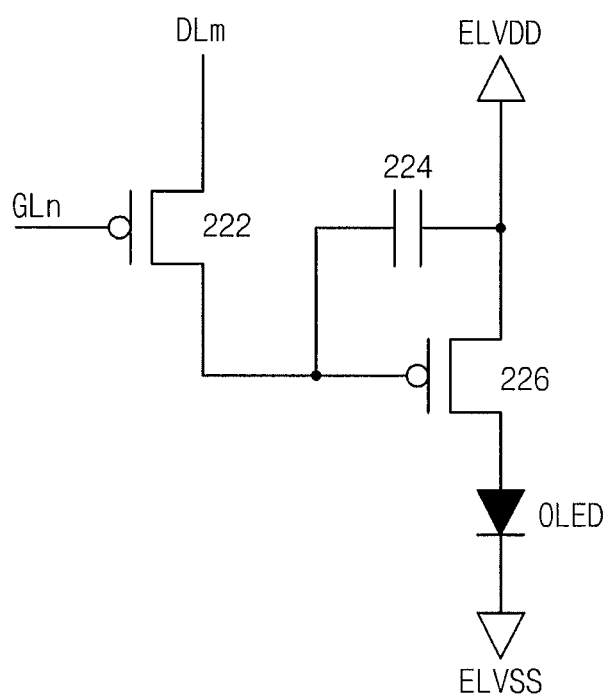
FIG. 3 is a circuit diagram exemplarily illustrating the display pixels of the display panel in FIG. 1.

FIG. 3 is a circuit diagram exemplarily illustrating the display pixels C1 to C3 of the display panel 200 in FIG. 1. For conciseness, FIG. 3 illustrates a display pixel that is coupled to the nth gate line GLn and the mth data line DLm.

Referring to FIGS. 1 and 3, each of the display pixels C1 to C3 may include a switching device, a storage device, and a light emitting device. The switching device may include the switching transistor 222 and the driving transistor 226. The storage device may be a capacitor 224, and the light emitting device may be an organic light emitting diode OLED.

Each of the display pixels C1 to C3 may display any one of red, green, and blue colors. A pixel cell displaying blue, a pixel cell displaying green, and a pixel cell displaying red configure one group, and may be repeatedly arranged in the first and second directions. Alternatively, a pixel cell displaying white may be additionally included in the one group.

The organic light emitting diode OLED may include an anode electrode, a cathode electrode, and an organic emission layer (e.g., an organic phosphor layer) therebetween. The organic emission layer may include a Hole Injection Layer (HIL), a Hole Transport Layer (HTL), an Emission Layer (EML), an Electron Transport Layer (ETL), and an Electron Injection Layer (EIL). The hole injection layer may be located adjacently to the anode electrode, and the electron injection layer may be located adjacently to the cathode electrode. Holes supplied through the hole injection layer and the hole transport layer recombine with electrons supplied through the electron injection layer and the electron transport layer in the emission layer, and thus the organic light emitting diode OLED may emit light.

The switching transistor 222 may be turned on by a gate voltage applied through the gate line GLn and transfer a data output voltage applied through the data line DLm to the storage capacitor 224. The storage capacitor 224 may store the data output voltage.

The driving transistor 226 may be turned on by the data output voltage Dv. When the driving transistor 226 is turned on and a voltage difference between first and second emission power sources ELVDD and ELVSS is equal to or more than a reference value, a driving current may be applied to the organic light emitting diode OLED. When the driving current is applied to the organic light emitting diode OLED, the organic light emitting diode OLED may emit light. The first emission power ELVDD may be a voltage having a level higher than the second emission power ELVSS. The first emission power ELVDD may be applied to the anode of the organic light emitting diode OLED, and the second emission power ELVSS may be applied to the cathode of the organic light emitting diode OLED.

The magnitude of the driving current may be determined by the data output voltage applied to the driving transistor 226. The brightness of the organic light emitting diode OLED may be proportional to the magnitude of the driving current. Accordingly, the brightness of the organic light emitting diode OLED may be determined by the data output voltage.

The display device according to an embodiment of the present invention may perform the display function and the scan function. In an operating method of the display device according to an embodiment of the present invention, by sequentially scanning first to third colors of a scanned object, a scan image may be acquired. This will be described below with reference to FIG. 4A.

Figure 4A:
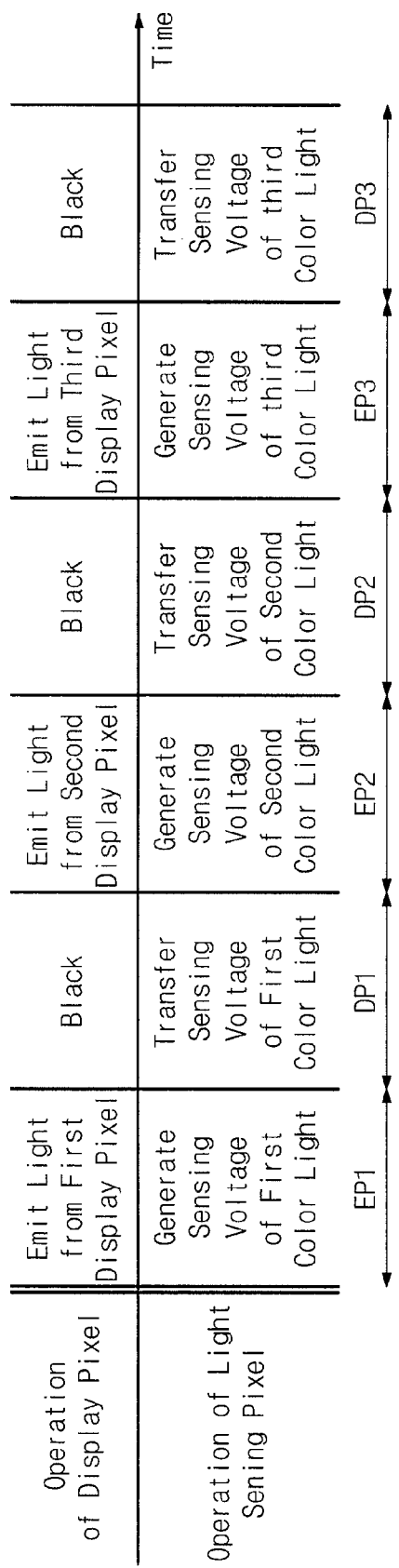
FIG. 4A is a diagram illustrating an operating method of a display device according to an embodiment of the present invention.

FIG. 4A is a diagram illustrating an operating method of a display device according to an embodiment of the present invention.

Referring to FIGS. 1 and 4A, in the operating method of the display device according to an embodiment of the present invention, a scanning operation may include first to third emission periods EP1 to EP3, and first to third delivery periods DP1 to DP3. The delivery periods DP1 to DP3 may be arranged between the emission periods EP1 to EP3. For example, in the operating method of the display device according to an embodiment of the present invention, a scanning operation may include a first emission period EP1, a first delivery period DP1, a second emission period EP2, a second delivery period DP2, a third emission period EP3, and a third delivery period DP3 according to a time order.

During the first emission period EP1, the first display pixels C1 may emit the first color light. During the first emission period EP1, the second and third display pixels C2 and C3 may not emit lights. Accordingly, the first color light emitted in the first display pixels C1 may be incident on a scanned object. During the first emission period EP1, the light sensing pixels PS may be driven and generate first sensing voltages. Specifically, the first color light incident on the scanned object may be reflected by the scanned object. The reflected first color light may be inputted to optic-electro converters included in the light sensing pixels PS, and thus the first sensing voltages may be generated.

An intensity of the reflected first color light may vary according to the position of the scanned object. For example, as the level of the first color light increases, the intensity of the reflected first color light may become stronger in the scanned object. The levels of the first sensing voltages generated in the light sensing pixels PS may be changed according to the intensity of the reflected first color light. Therefore, the first sensing voltages generated in the light sensing pixels PS may include information of the first color of the scanned object.

During the first delivery period DP1, the first to third display pixels C1 to C3 may not emit light. During the first delivery period DP1, the first sensing voltages may be delivered to the sensing pixel data processor 140.

During the second emission period EP2, the second display pixels C2 may emit the second color light, but the first and third display pixels C1 and C3 may not emit light. Accordingly, the second color light emitted in the second display pixels C2 may be reflected by the scanned object. The reflected second color light may be inputted to the optic-electro converters included in the light sensing pixels PS, and thus the second sensing voltages may be generated. The second sensing voltages may include information on the second color of the scanned object.

During the second delivery period DP2, the first to third display pixels C1 to C3 may not emit light. During the second delivery period DP2, the second sensing voltages may be delivered to the sensing pixel data processor 140.

During the third emission period EP3, the third display pixels C3 may emit the third color light, but the first and second display pixels C1 and C2 may not emit light. Accordingly, the third color light emitted in the third display pixels C3 may be reflected by the scanned object. The reflected third color light may be inputted to the optic-electro converters included in the light sensing pixels PS, and thus the third sensing voltages may be generated. The third sensing voltages may include information on the third color of the scanned object.

During the third delivery period DP3, the first to third display pixels C1 to C3 may not emit light. During the third delivery period DP3, the third sensing voltages may be delivered to the sensing pixel data processor 140.

Through the emission periods EP1 to EP3 and the delivery periods DP1 to DP3, the first to third color sensing voltages may be delivered to the sensing pixel data processor 140. The first to third color sensing voltages may include information of the first to third colors of the scanned object. Therefore, by sequentially scanning the first to third colors of the scanned object, the scanned image data SID of the scanned object may be acquired.

In the above-described embodiment, the scanned image data SID of the scanned object is acquired by sequentially scanning the first to third colors. In this case, the scanned image data may include information of the first to third colors of the scanned object. In an operation method of a display device according to a modification example of an embodiment of the present invention, a scanned object may be scanned in white and black. This will be described below with reference to FIGS. 1 and 4B.

Figure 4B:
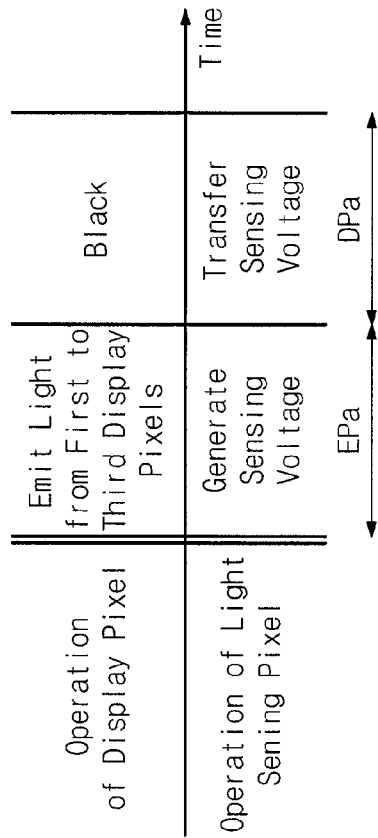
FIG. 4B is a diagram illustrating an operating method of a display device according to a modified example of an embodiment of the present invention.

FIG. 4B is a diagram illustrating an operating method of a display device according to a modified example of an embodiment of the present invention.

Referring to FIGS. 1 and 4B, the operating method of the display device according to a modified example of an embodiment of the present invention may include an emission period EPa and a delivery period DPa. During the emission period EPa, the first to third display pixels C1 to C3 may emit the first to third color lights concurrently (e.g., simultaneously). Therefore, the display panel 200 may emit white color light. During the emission period EPa, the white color light emitted in the first to third display pixels C1 to C3 may be incident on a scanned object. During the delivery period DPa, the light sensing pixels PS may be driven and generate sensing voltages.

The scanned object may reflect the white color light emitted in the first to third display pixels C1 to C3. Therefore, the sensing voltages generated in the sensing pixels PS may include information on the white-and-black shade of the scanned object. Accordingly, white-and-black scan of the scanned object may be performed.

As described above, the light sensing pixels PS included in the display device according to an embodiment of the present invention may generate and deliver the sensing voltages. The light sensing pixels included in the display device according to an embodiment of the present invention and embodiments of an operating method thereof will be described below in detail with reference to FIGS. 5A to 8A and 5B to 8B. In FIGS. 5A to 8A, for conciseness, a light sensing pixel coupled to an xth sensing voltage transfer control line STx and a yth sensing data line SDy is illustrated.

A light sensing pixel and an operating method thereof according to a first embodiment of the present invention will be described below.

Figure 5A:
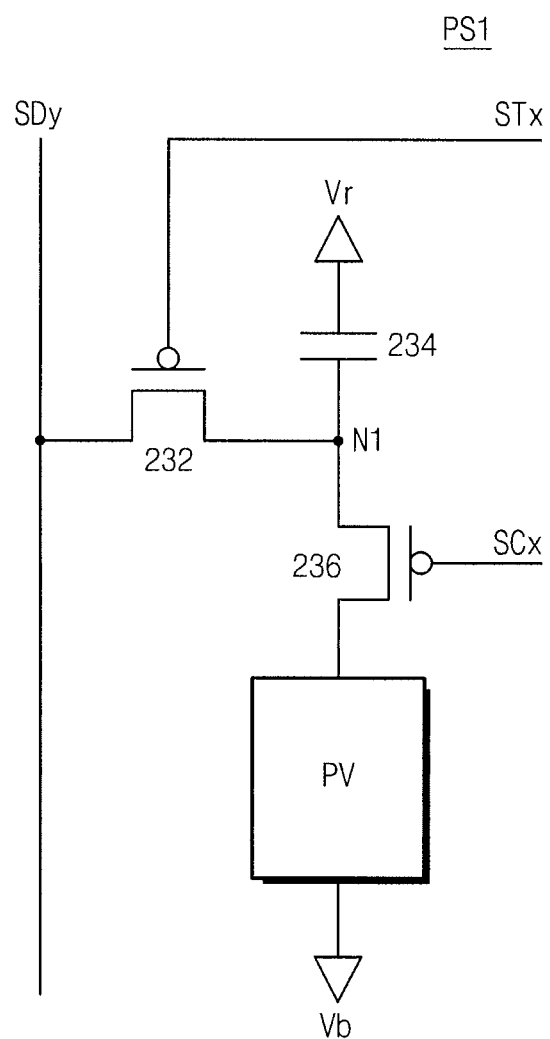
FIG. 5A is a circuit diagram illustrating a light sensing pixel according to a first embodiment of the present invention.

FIG. 5A illustrates the light sensing pixel PS of the display panel 200 that has been described above with reference to FIG. 1, and is a circuit diagram illustrating a light sensing pixel according to a first embodiment of the present invention.

Referring to FIG. 5A, a light sensing pixel PS1 according to the first embodiment of the present invention may include a first transistor 232, a storage capacitor 234, a second transistor 236, and an optic-electror converter PV. A control terminal of the first transistor 232 may be coupled to the sensing voltage transfer control line STx, an output terminal of the first transistor 232 may be coupled to the sensing data line SDy, and an input terminal of the first transistor 232 may be coupled to a node N1. A control terminal of the second transistor 236 may be coupled to the sensing voltage generation control line SCx, an input terminal of the second transistor 236 may be coupled to one terminal of the optic-electro converter PV, and an output terminal of the second transistor 236 may be coupled to the node N1. One electrode of the storage capacitor 234 may be coupled to the node N1. Another electrode of the capacitor 234 may receive a reference voltage Vr, and another terminal of the optic-electro converter PV may receive a bias voltage Vb.

An operating method of a light sensing pixel according to the first embodiment of the present invention will be described below. FIG. 5B is a timing diagram exemplarily showing operating methods of light sensing pixels according to the first embodiment of the present invention.

Referring to FIGS. 1, 5A, and 5B, the light sensing pixels PS1 may perform a reset operation, a sensing voltage generating operation and a sensing voltage transferring operation according to a time order. In the reset operation, a high-level voltage may be applied to the sensing voltage generation control lines SC1 to SCx, a low-level voltage may be applied to the sensing voltage transfer control lines ST1 to STx, and thus, the first transistors 232 of the light sensing pixels PS1 may be turned on and the second transistors 236 may be turned off. In the reset operation, a reset voltage may be applied to the sensing data lines SD1 to SDy, the reset voltage may be applied to the node N1, and thus the light sensing pixels PS1 may be reset.

In the sensing voltage generating operation, a low-level voltage may be applied to the sensing voltage generation control lines SC1 to SCx, and a high-level voltage may be applied to the sensing voltage transfer control lines ST1 to STx. Accordingly, the first transistors 232 of the light sensing pixels PS1 may be turned off, and the second transistors 236 may be turned on. Therefore, the sensing voltages generated by the optic-electro converters of the light sensing pixels PS1 may be transferred to the nodes N1, and the storage capacitors 234 may store the sensing voltages.

In the sensing voltage transferring operation, a high-level voltage may be applied to the sensing voltage generation control lines SC1 to SCx, and a low-level voltage may be sequentially applied to the sensing voltage transfer control lines ST1 to STx in an order from the first sensing voltage transfer control line ST1 to the xth sensing voltage transfer control line STx. Accordingly, the second transistors 236 of the light sensing pixels PS1 may be turned off. Moreover, the first transistors 232 of the light sensing pixels PS1 may be sequentially turned on in an order from the first transistors of the light sensing pixels of a first column coupled to the first sensing voltage transfer control line ST1, to the first transistors of the light sensing pixels of an xth column coupled to the xth sensing voltage transfer control line STx. Therefore, from sensing voltages stored in the storage capacitors of the light sensing pixels of the first column to sensing voltages stored in the storage capacitors of the light sensing pixels of the xth column, the sensing voltages may be sequentially transferred to the sensing pixel data processor 140 through the sensing data lines SD1 to SDy.

A light sensing pixel and an operating method thereof, according to a second embodiment of the present invention, will be described below.

Figure 6A:
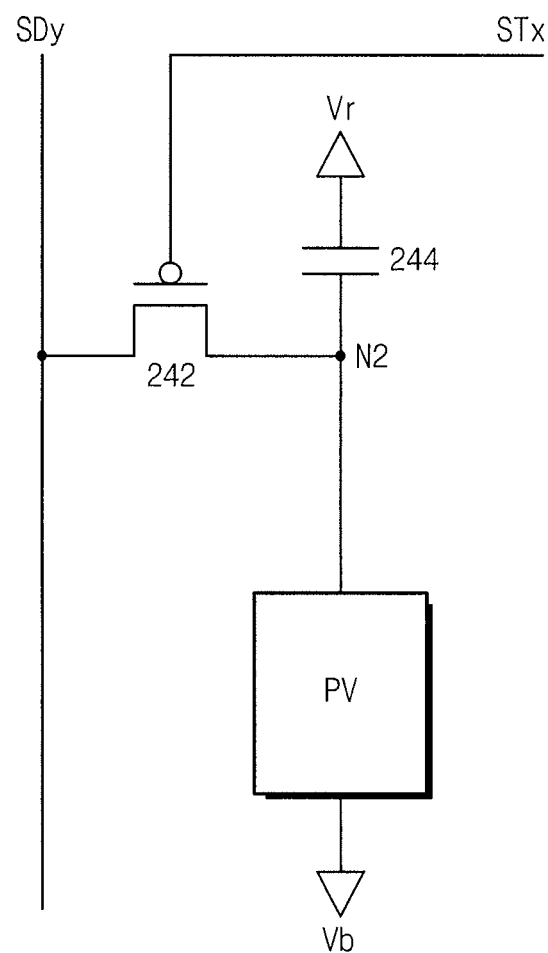
FIG. 6A is a circuit diagram illustrating a light sensing pixel according to a second embodiment of the present invention.

FIG. 6A illustrates the light sensing pixel PS of the display panel 200 that has been described above with reference to FIG. 1, and is a circuit diagram illustrating a light sensing pixel according to the second embodiment of the present invention. In the light sensing pixel according to the second embodiment of the present invention, the sensing voltage generation control lines SC1 to SCx of FIG. 1 may be omitted.

Referring to FIG. 6A, a light sensing pixel PS2 according to a second embodiment of the present invention may include a transistor 242, a storage capacitor 244, and an optic-elector converter PV. A control terminal of the transistor 242 may be coupled to the sensing voltage transfer control line STx, an output terminal of the transistor 242 may be coupled to the sensing data line SDy, and an input terminal of the transistor 242 may be coupled to a node N2. One end of the optic-electro converter PV and one electrode of the storage capacitor 244 may be coupled to the node N2. Another electrode of the capacitor 244 may receive a reference voltage Vr, and another terminal of the optic-electro converter PV may receive a bias voltage Vb.

Figure 6B:
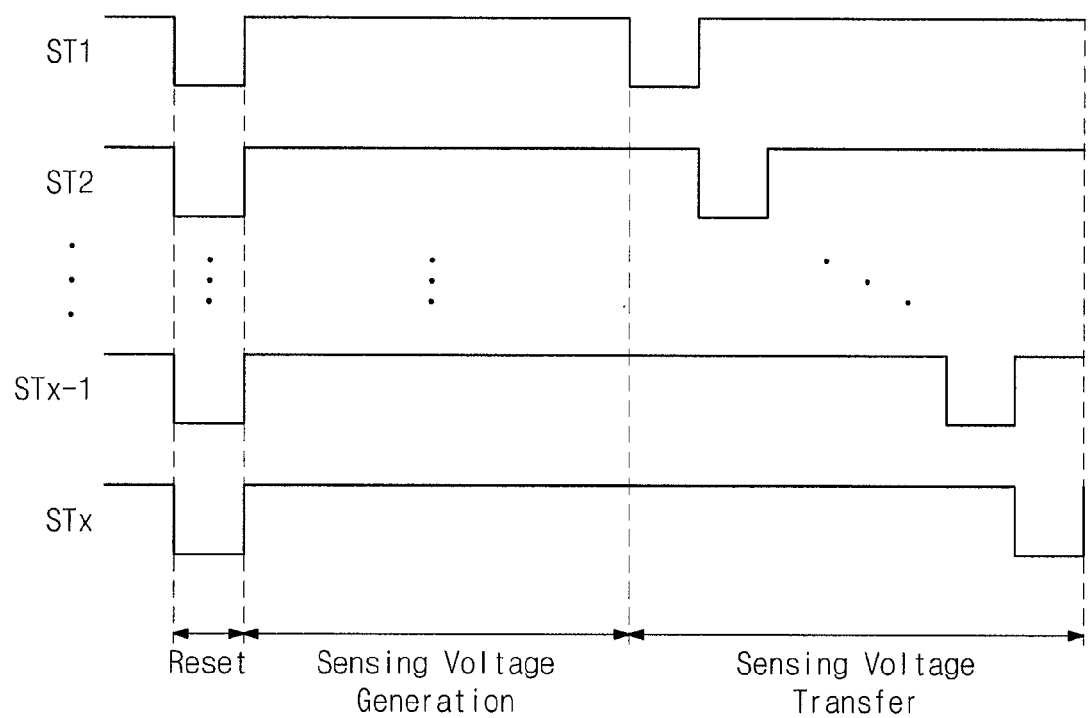
FIG. 6B is a timing diagram exemplarily showing operating methods of light sensing pixels according to a second embodiment of the present invention.

An operating method of a light sensing pixel according to a second embodiment of the present invention will be described below. FIG. 6B is a timing diagram exemplarily showing operating methods of light sensing pixels according to a second embodiment of the present invention.

Referring to FIGS. 1, 6A, and 6B, the light sensing pixels PS2 may perform a reset operation, a sensing voltage generating operation, and a sensing voltage transferring operation according to a time order. In the reset operation, a low-level voltage may be applied to the sensing voltage transfer control lines ST1 to STx, and thus the transistors 242 of the light sensing pixels PS2 may be turned on. In the reset operation, a reset voltage may be applied to the sensing data lines SD1 to SDy, the reset voltage may be applied to the node N2, and thus the light sensing pixels PS2 may be reset.

A high-level voltage may be applied to the sensing voltage transfer control lines ST1 to STx. Accordingly, the transistors 242 of the light sensing pixels PS2 may be turned off. Therefore, the sensing voltages generated by the optic-electro converters of the light sensing pixels PS2 may be transferred to the nodes N2, and the storage capacitors 244 may store the sensing voltages.

In the sensing voltage transferring operation, a low-level voltage may be sequentially applied to the sensing voltage transfer control lines ST1 to STx in an order from the first sensing voltage transfer control line ST1 to the xth sensing voltage transfer control line STx. Accordingly, the transistors 242 of the light sensing pixels PS2 may be sequentially turned on in an order from the first transistors of the light sensing pixels of a first column coupled to the first sensing voltage transfer control line ST1, to the first transistors of the light sensing pixels of an xth column coupled to the xth sensing voltage transfer control line STx. Therefore, from sensing voltages stored in the storage capacitors of the light sensing pixels of the first column, to sensing voltages stored in the storage capacitors of the light sensing pixels of the xth column, the sensing voltages may be sequentially transferred to the sensing pixel data processor 140 through the sensing data lines SD1 to SDy.

A light sensing pixel and an operating method thereof, according to a third embodiment of the present invention, will be described below.

Figure 7A:
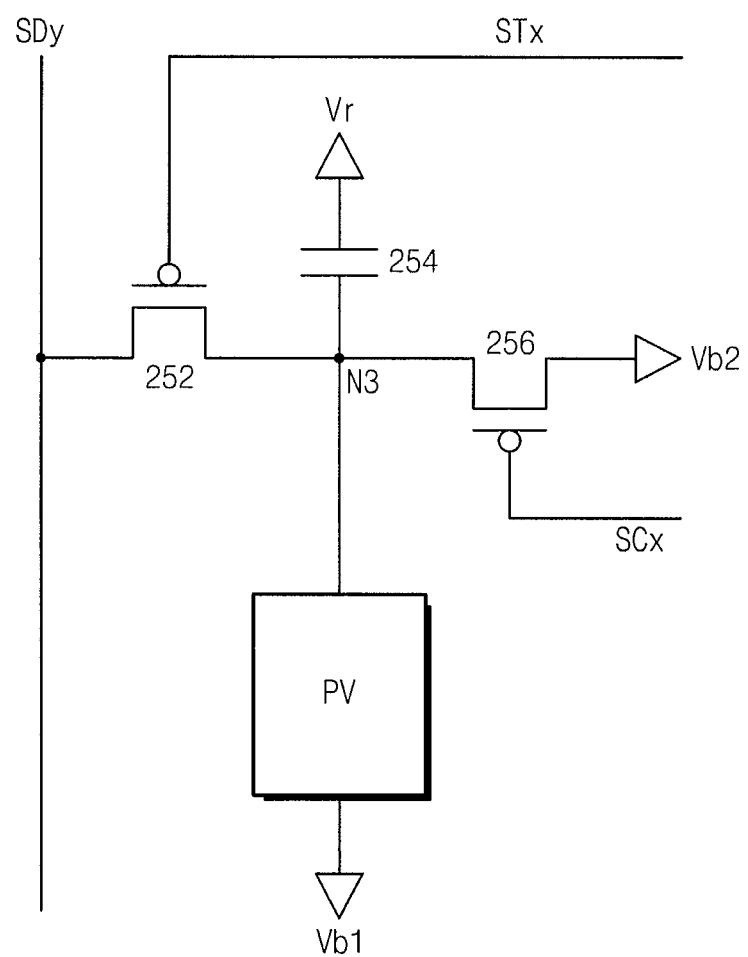
FIG. 7A is a circuit diagram illustrating a light sensing pixel according to a third embodiment of the present invention.

FIG. 7A illustrates the light sensing pixel PS of the display panel 200 that has been described above with reference to FIG. 1, and is a circuit diagram illustrating a light sensing pixel according to the third embodiment of the present invention.

Referring to FIG. 7A, a light sensing pixel PS3 according to the third embodiment of the present invention may include a first transistor 252, a storage capacitor 254, a second transistor 256, and an optic-elector converter PV. A control terminal of the first transistor 252 may be coupled to the sensing voltage transfer control line STx, an output terminal of the first transistor 252 may be coupled to the sensing data line SDy, and an input terminal of the first transistor 252 may be coupled to a node N3. One terminal of the optic-electro converter PV may be coupled to the node N3, and another terminal of the optic-electro converter PV may receive a first bias voltage Vb1. A control terminal of the second transistor 256 may be coupled to the sensing voltage generation control line SCx, an input terminal of the second transistor 256 may be coupled to the one terminal of the optic-electro converter PV, and an output terminal of the second transistor 256 may be coupled to the node N3.

Figure 7B:
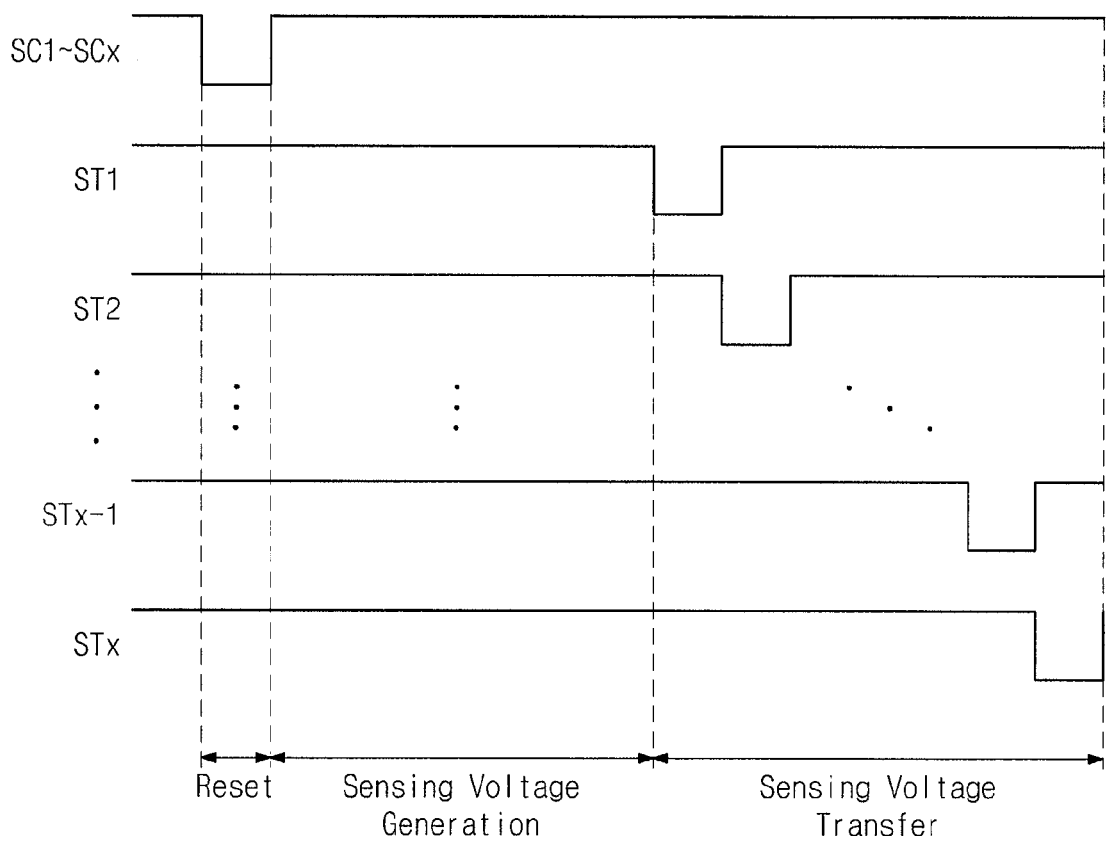
FIG. 7B is a timing diagram exemplarily showing operating methods of light sensing pixels according to a third embodiment of the present invention.

An operating method of a light sensing pixel according to a third embodiment of the present invention will be described below. FIG. 7B is a timing diagram exemplarily showing operating methods of light sensing pixels according to a third embodiment of the present invention.

Referring to FIGS. 1, 7A, and 7B, the light sensing pixels PS3 may perform a reset operation, a sensing voltage generating operation, and a sensing voltage transferring operation according to a time order. In the reset operation, a low-level voltage may be applied to the sensing voltage generation control lines SC1 to SCx, a high-level voltage may be applied to the sensing voltage transfer control lines ST1 to STx, and thus, the first transistors 252 of the light sensing pixels PS3 may be turned off and the second transistors 256 may be turned on. Therefore, a second bias voltage Vb2 may be transferred to the node N3, and thus the light sensing pixels PS3 may be reset.

In the sensing voltage generating operation, a high-level voltage may be applied to the sensing voltage generation control lines SC1 to SCx, and a low-level voltage may be applied to the sensing voltage transfer control lines ST1 to STx. Accordingly, the first and second transistors 252 and 256 of the light sensing pixels PS3 may be turned off. Therefore, the sensing voltages generated by the optic-electro converters of the light sensing pixels PS3 may be transferred to the nodes N3, and the storage capacitors 254 may store the sensing voltages.

In the sensing voltage transferring operation, a high-level voltage may be applied to the sensing voltage generation control lines SC1 to SCx, and a low-level voltage may be sequentially applied to the sensing voltage transfer control lines ST1 to STx, in an order from the first sensing voltage transfer control line ST1 to the xth sensing voltage transfer control line STx. Accordingly, the second transistors 256 of the light sensing pixels PS3 may be turned off. Moreover, the first transistors 252 of the light sensing pixels PS3 may be sequentially turned on in an order from the first transistors of the light sensing pixels of a first column connected to the first sensing voltage transfer control line ST1, to the first transistors 252 of the light sensing pixels of an xth column coupled to the xth sensing voltage transfer control line STx. Therefore, from sensing voltages stored in the storage capacitors 254 of the light sensing pixels of the first column, to sensing voltages stored in the storage capacitors of the light sensing pixels of the xth column, the sensing voltages may be sequentially transferred to the sensing pixel data processor 140 through the sensing data lines SD1 to SDy.

A light sensing pixel and an operating method thereof according to a fourth embodiment of the present invention will be described below.

Figure 8A:
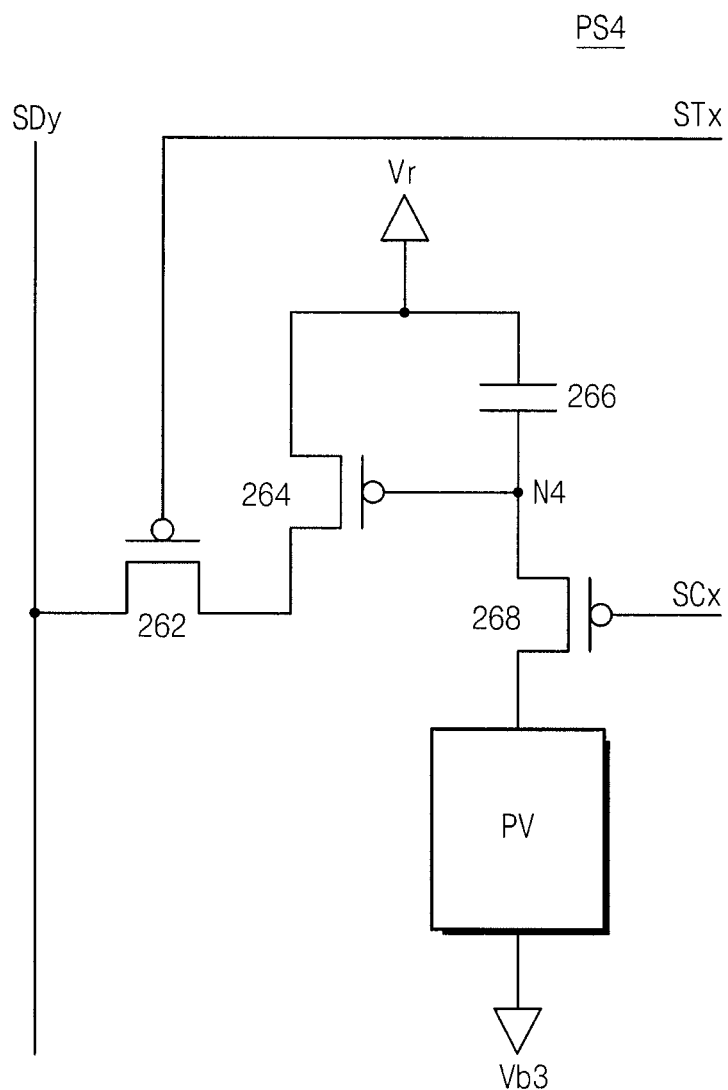
FIG. 8A is a circuit diagram illustrating a light sensing pixel according to a fourth embodiment of the present invention.

FIG. 8A illustrates the light sensing pixel PS of the display panel 200 that has been described above with reference to FIG. 1, and is a circuit diagram illustrating a light sensing pixel according to the fourth embodiment of the present invention.

Referring to FIG. 8A, a light sensing pixel PS4 according to the fourth embodiment of the present invention may include first to third transistors 262, 264, and 268, a storage capacitor 266, and an optic-elector converter PV. A control terminal of the first transistor 262 may be coupled to the sensing voltage transfer control line STx, an output terminal of the first transistor 262 may be coupled to the sensing data line SDy, and an input terminal of the first transistor 262 may be coupled to an output terminal of the second transistor 264. A control terminal of the second transistor 264 may be coupled to a node N4, and a reference voltage Vr may be applied to an input terminal of the second transistor 264. One electrode of the storage capacitor 264 may be coupled to the node N4, and the reference voltage Vr may be applied to another electrode of the storage capacitor 266. A control terminal of the third transistor 268 may be coupled to the sensing voltage generation control line SCx, an output terminal of the third transistor 268 may be coupled to one terminal of the optic-electro converter PV, and an input terminal of the third transistor 268 may be coupled to the node N4. A bias voltage Vb3 may be applied to another terminal of the optic-electro converter PV.

Figure 8B:
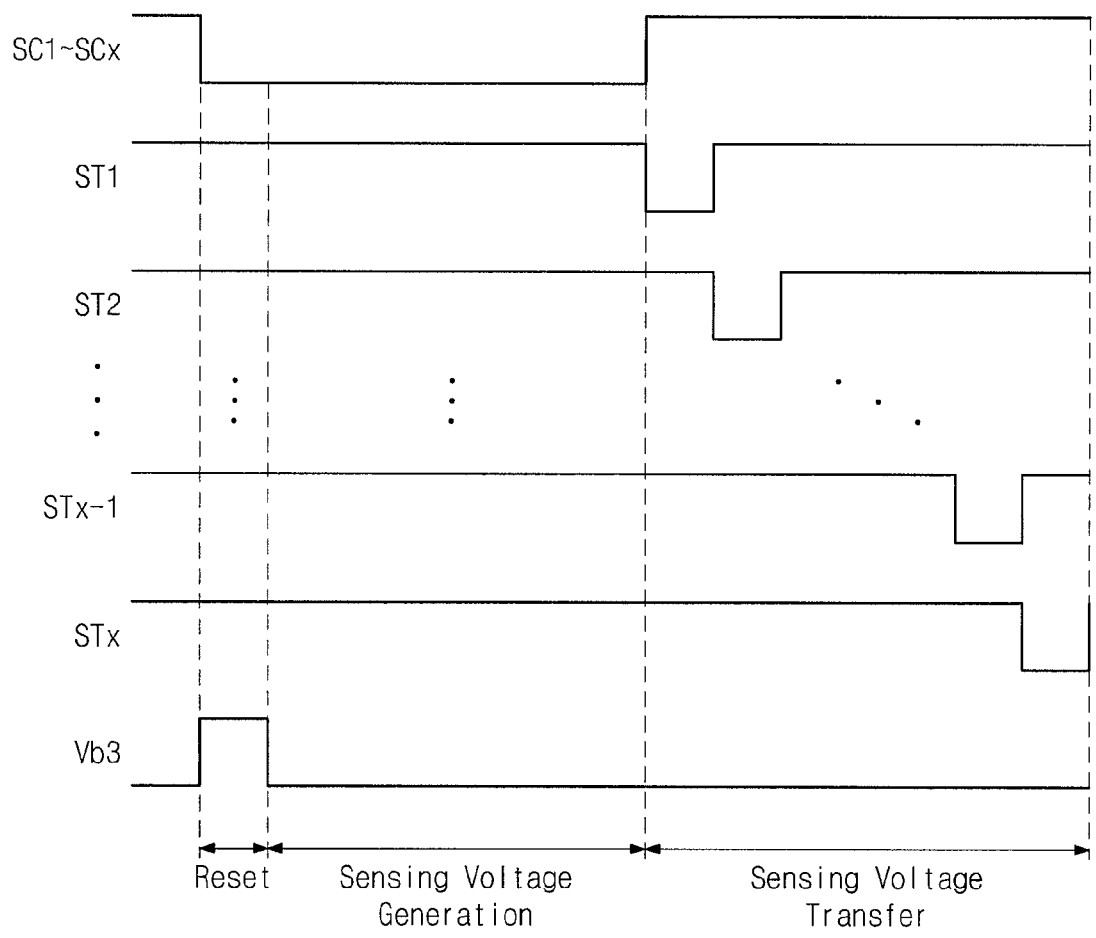
FIG. 8B is a timing diagram exemplarily showing operating methods of light sensing pixels according to a fourth embodiment of the present invention.

An operating method of a light sensing pixel according to the fourth embodiment of the present invention will be described below. FIG. 8B is a timing diagram exemplarily showing operating methods of light sensing pixels according to the fourth embodiment of the present invention.

Referring to FIGS. 1, 8A, and 8B, the light sensing pixels PS4 may perform a reset operation, a sensing voltage generating operation, and a sensing voltage transferring operation according to a time order. In the reset operation, a low-level voltage may be applied to the sensing voltage generation control lines SC1 to SCx, a high-level voltage may be applied to the sensing voltage transfer control lines ST1 to STx, and the bias voltage Vb3 may have a high level. Thus, the first transistors 262 of the light sensing pixels PS4 may be turned off, and the third transistors 268 may be turned on. In a case where the optic-electro converter PV includes a PN diode, a forward current flows in the optic-electro converter PV when the bias voltage Vb3 has a high level, and the bias voltage Vb3 may be transferred to the node N4. Accordingly the light sensing pixels PS4 may be reset.

In the sensing voltage generating operation, a low-level voltage may be applied to the sensing voltage generation control lines SC1 to SCx, and a high-level voltage may be applied to the sensing voltage transfer control lines ST1 to STx. Accordingly, the first transistors 262 of the light sensing pixels PS4 may be turned off, and the third transistors 268 may be turned on. Therefore, the sensing voltages generated by the optic-electro converters of the light sensing pixels PS4 may be transferred to the nodes N4, and the storage capacitors 266 may store the sensing voltages.

The second transistors 264 may be turned on by the sensing voltages transferred to the nodes N4. The second transistors 264 may transfer total or a portion of the reference voltage Vr to the input terminals of the first transistors 262 according to levels of the sensing voltages.

In the sensing voltage transferring operation, a high-level voltage may be applied to the sensing voltage generation control lines SC1 to SCx, and a low-level voltage may be sequentially applied to the sensing voltage transfer control lines ST1 to STx in an order from the first sensing voltage transfer control line ST1, to the xth sensing voltage transfer control line STx. Accordingly, the third transistors 268 of the light sensing pixels PS4 may be turned off. Moreover, the first transistors 262 of the light sensing pixels PS4 may be sequentially turned on in an order from the first transistors of the light sensing pixels of a first column coupled to the first sensing voltage transfer control line ST1, to the first transistors of the light sensing pixels of an xth column coupled to the xth sensing voltage transfer control line STx. Therefore, from sensing voltages stored in the storage capacitors of the light sensing pixels of the first column to sensing voltages stored in the storage capacitors of the light sensing pixels of the xth column, the sensing voltages may be sequentially transferred to the sensing pixel data processor 140 through the sensing data lines SD1 to SDy.

As described above with reference to FIG. 1, the display device according to an embodiment of the present invention may include the plurality of display pixels C1 to C3, and the plurality of unit cell 210 respectively including one light sensing pixel PS. An arrangement relationship between the light sensing pixel PS and the display pixels C1 to C3 of the unit cell 210 included in the display panel 200 of FIG. 1 will be described below with reference to FIGS. 9A to 9G.

FIGS. 9A to 9G are for describing the unit cell of the display panel that has been described above with reference to FIG. 1, and are diagrams illustrating an arrangement relationship between a light sensing pixel and a plurality of display pixels in a unit cell according to fifth to eleventh embodiments of the present invention.

Figure 9A:
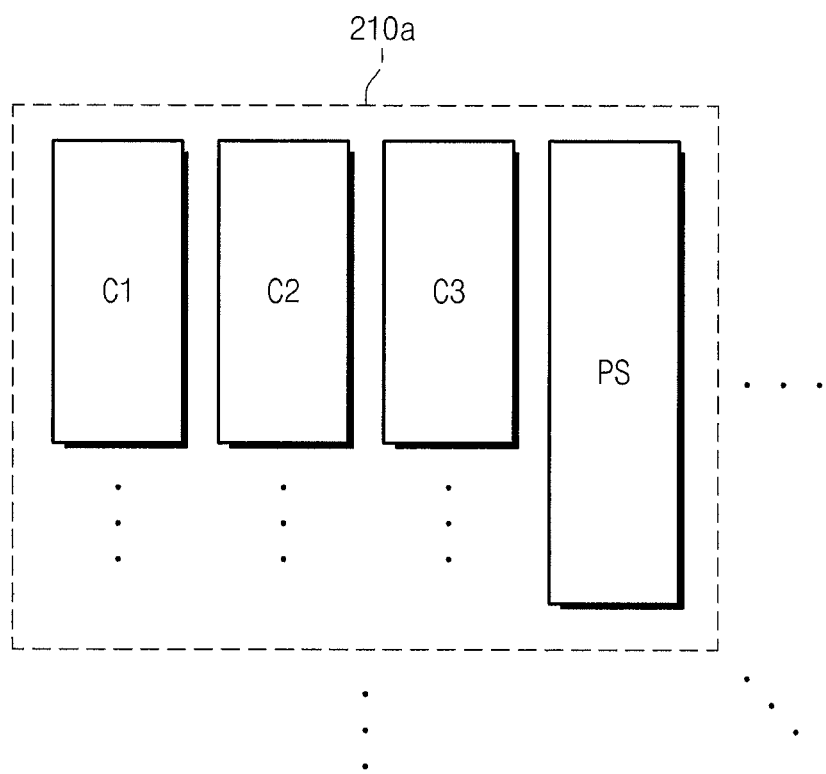
FIGS. 9A to 9G are diagrams illustrating an arrangement relationship between a light sensing pixel and a plurality of display pixels in a unit cell according to fifth to eleventh embodiments of the present invention.

Referring to FIG. 9A, a unit cell 210a according to a fifth embodiment of the present invention may include one light sensing pixel PS and a plurality of display pixels C1 to C3. The light sensing pixel PS may be extended in a first direction. In a plan view, the light sensing pixel PS has a long side in a first direction. A plurality of first display pixels C1 may be arranged sequentially along the first direction. A plurality of second display pixels C2 may be arranged sequentially along the first direction. A plurality of third display pixels C3 may be arranged sequentially along the first direction. The plurality of first to third display pixels C1 to C3 in the unit cell 210*a* may configure a display pixel group. The display pixel group may be located at one side of the light sensing pixel PS.

Figure 9B:
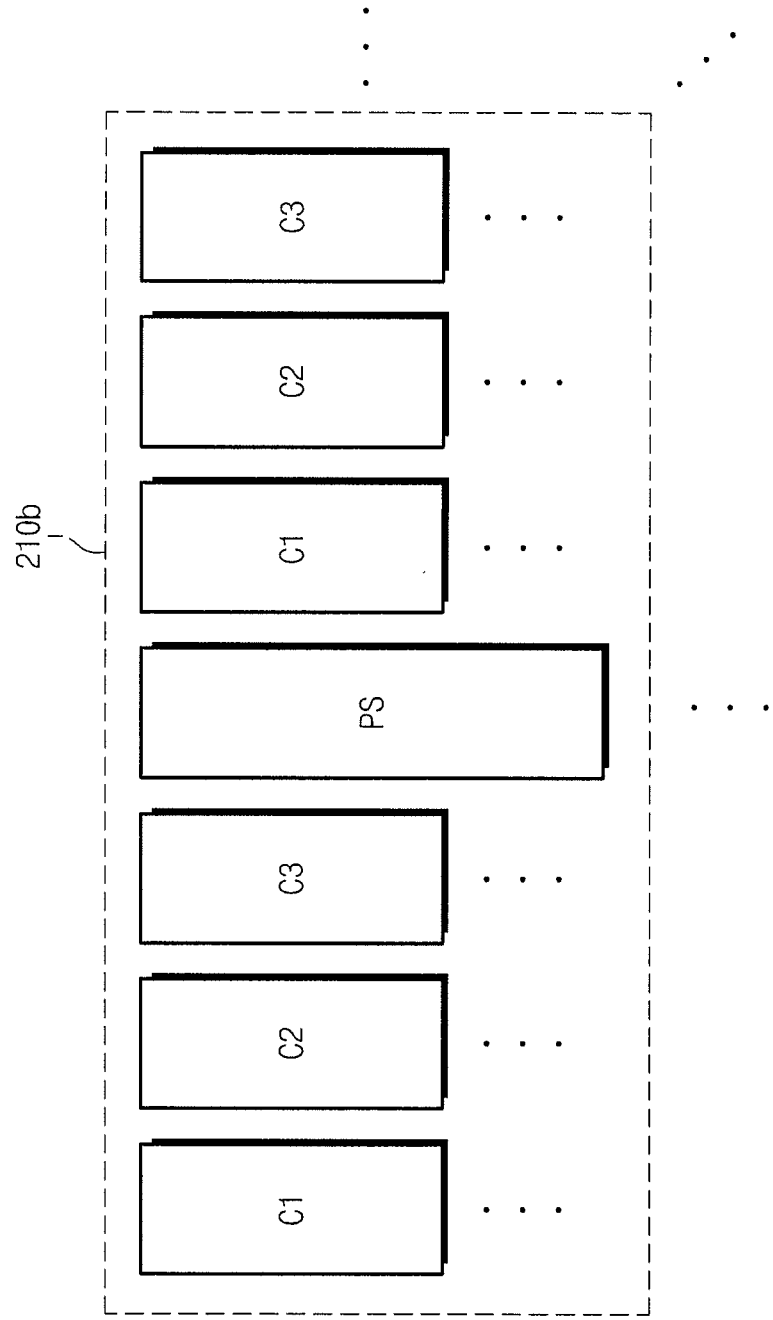

Referring to FIG. 9B, as described above with reference to FIG. 9A, a unit cell 210*b* according to a sixth embodiment of the present invention may include a light sensing pixel PS extended in the first direction, and a display pixel group. Unlike the embodiment shown in FIG. 9A, the display pixel group may be provided in plurality. The display pixel groups may be located at both sides of the light sensing pixel PS.

Figure 9C:
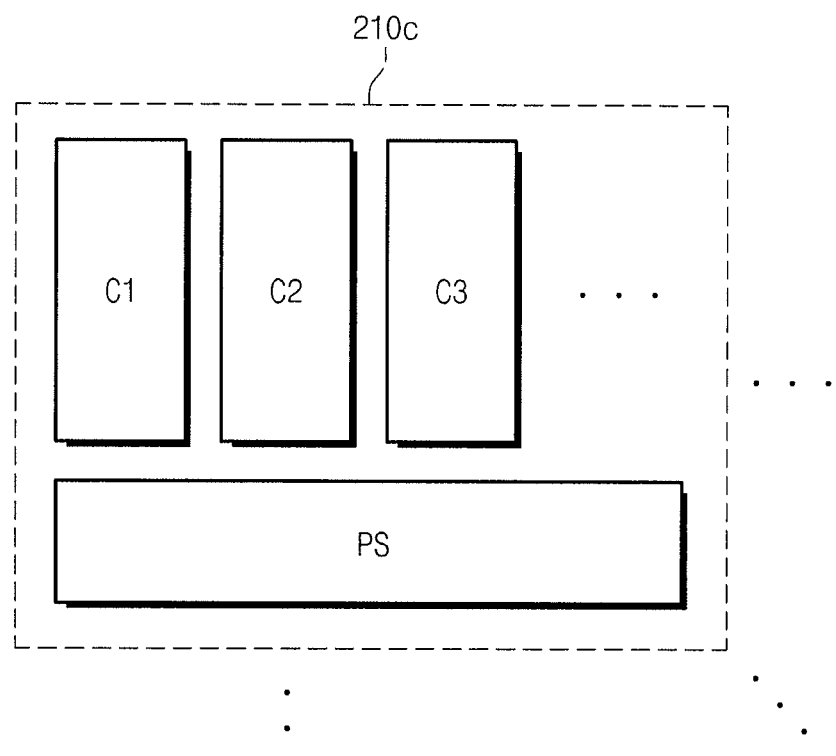

Referring to FIG. 9C, a unit cell 210*c* according to a seventh embodiment of the present invention may include one light sensing pixel PS and a plurality of display pixels C1 to C3. The light sensing pixel PS may be extended in a second direction. In a plan view, the light sensing pixel PS has a long side in the second direction. The plurality of first display pixels C1 may be sequentially arranged along the second direction. The plurality of second display pixels C2 may be sequentially arranged along the second direction. The plurality of third display pixels C3 may be sequentially arranged along the second direction. The plurality of first to third display pixels C1 to C3 in the unit cell 210*c* may configure a display pixel group. The display pixel group may be located at one side of the light sensing pixel PS.

Figure 9D:
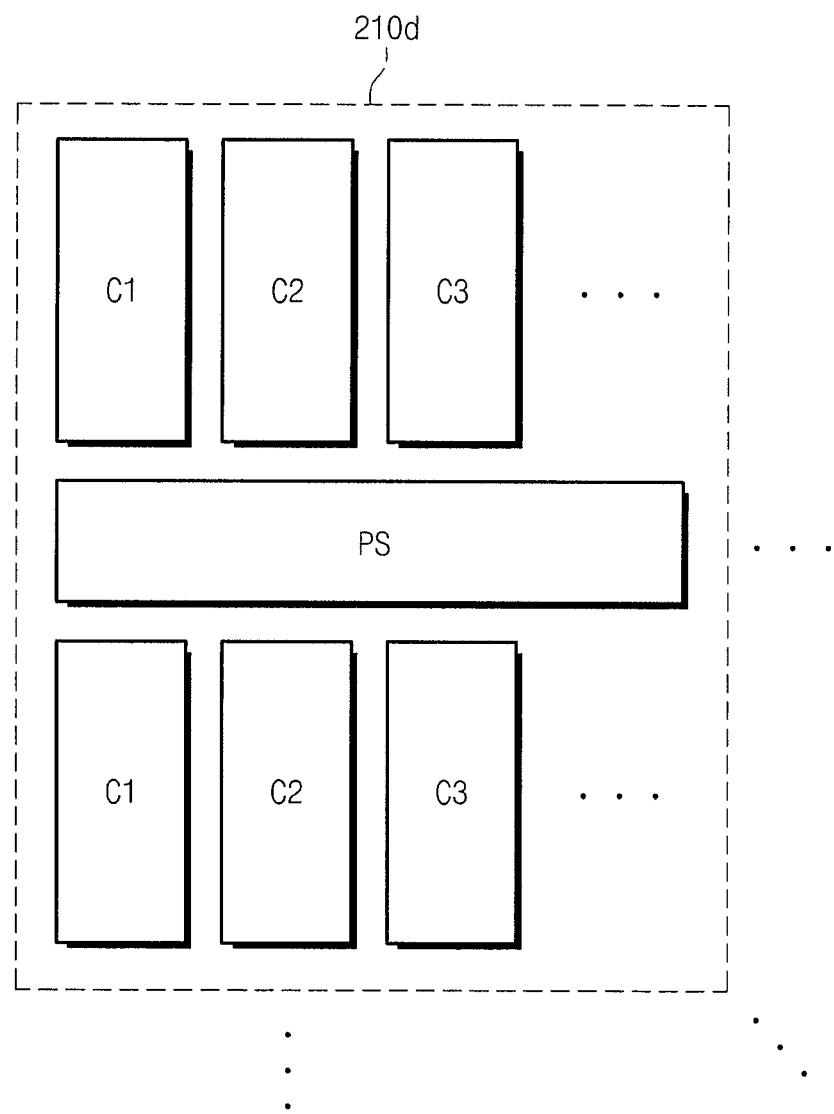

Referring to FIG. 9D, as described above with reference to FIG. 9C, a unit cell 210*d* according to an eighth embodiment of the present invention may include a light sensing pixel PS extended in the second direction, and a display pixel group. Unlike the embodiment illustrated in FIG. 9C, the display pixel group may be provided in plurality. The display pixel groups may be located at both sides of the light sensing pixel PS.

Figure 9E:
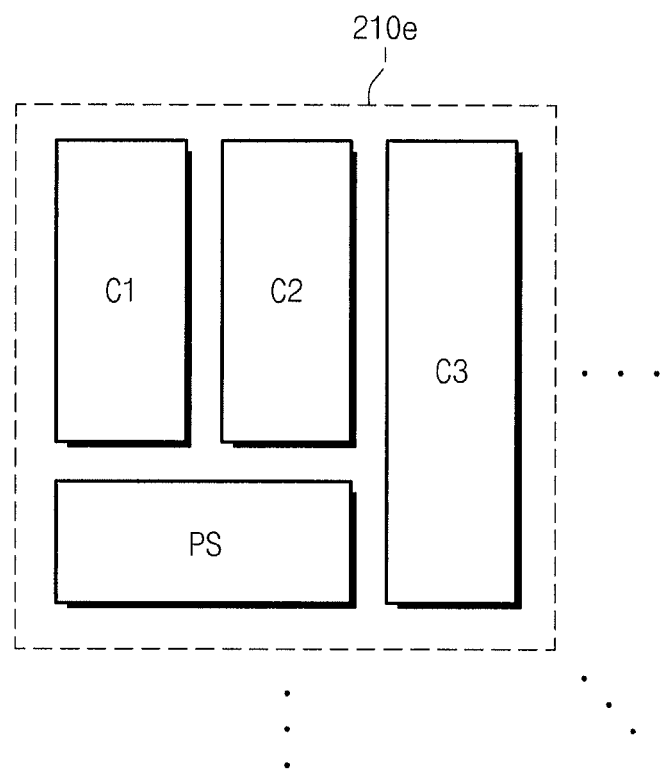

Referring to FIG. 9E, a unit cell 210*e* according to a ninth embodiment of the present invention may include one light sensing pixel PS and first to third display pixels C1 to C3. Among the first to third display pixels C1 to C3, the third display pixel C3 may be larger than the first and second display pixels C1 and C2. For example, the third display pixel C3 may include an organic light emitting material for displaying blue.

Figure 9F:
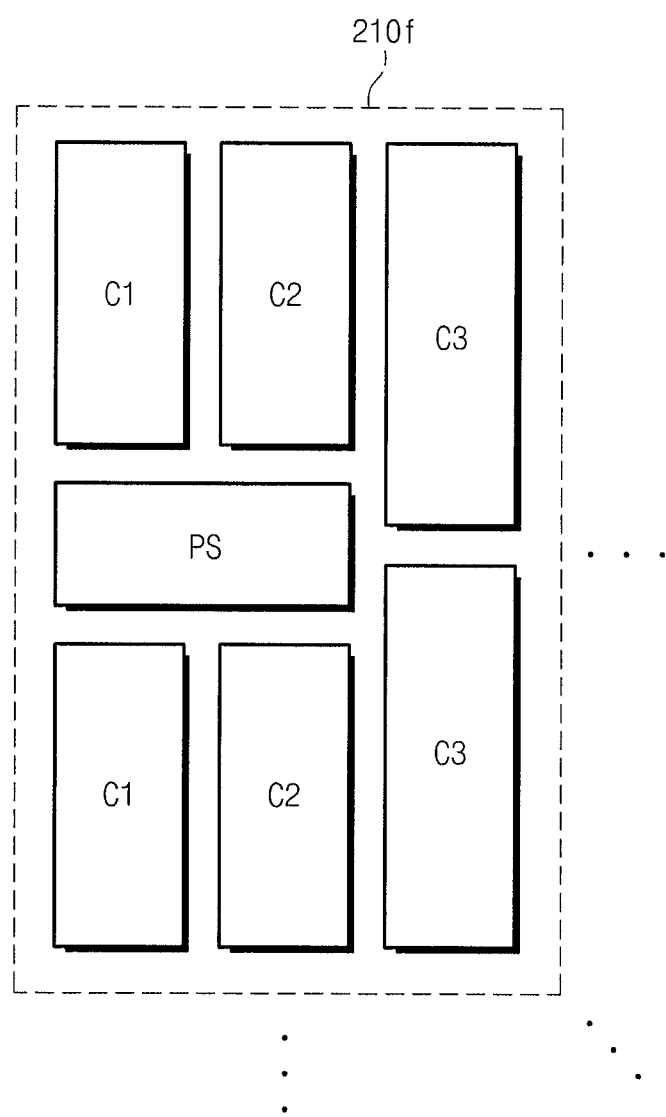

Referring to FIG. 9F, as described above with reference to FIG. 9E, a unit cell 210*f* according to a tenth embodiment of the present invention may include one light sensing pixel PS, a first display pixel C1, a second display pixel C2, and a third display pixel C3 that is larger than the first and second display pixels C1 and C2. Unlike the embodiment shown in FIG. 9E, the unit cell 210*f* may include a plurality of the first display pixels C1, a plurality of the second display pixels C2, and a plurality of the third display pixels C3.

Figure 9G:
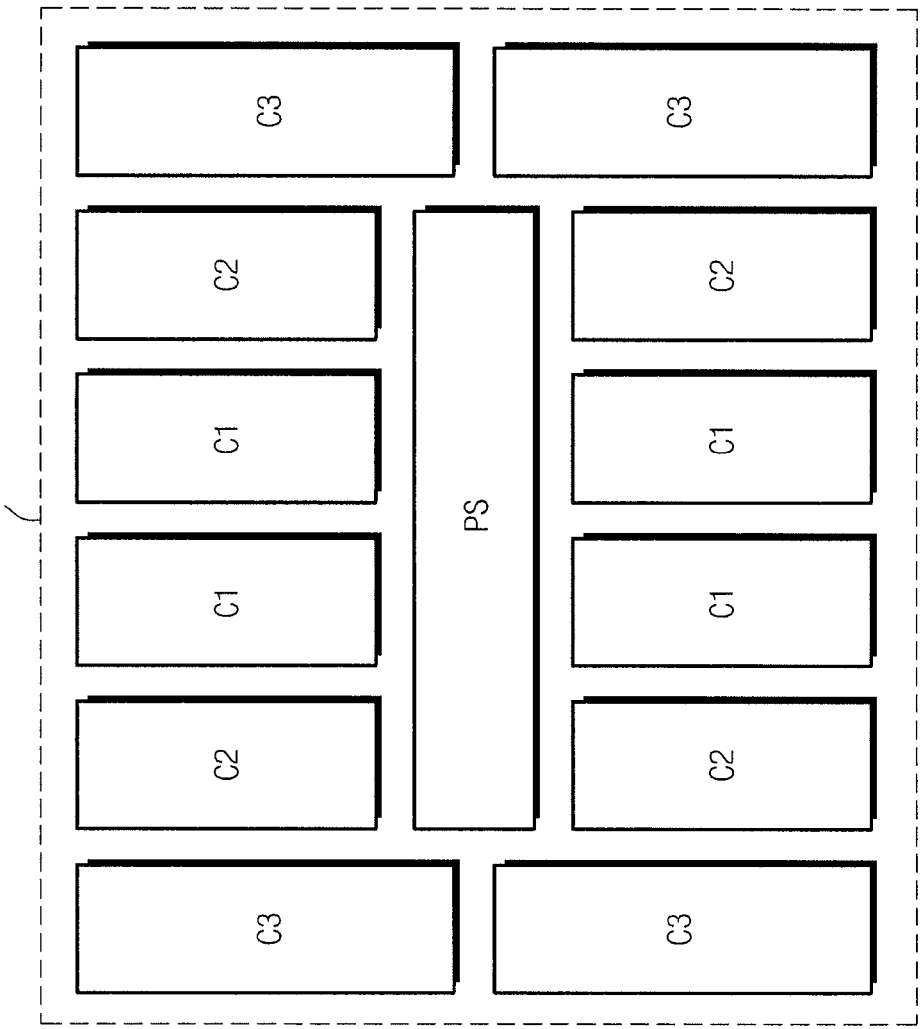

Referring to FIG. 9G, a unit cell 210*g* according to an eleventh embodiment of the present invention may include one light sensing pixel PS, a plurality of first display pixels C1, a plurality of second display pixels C2, and a plurality of third display pixels C3. Among the first to third display pixels C1 to C3, the size of the third display pixel C3 may be larger than the sizes of the first and second display pixels C1 and C2. For example, the third display pixels C3 may include an organic light emitting material for displaying blue. The first to third display pixels C1 to C3 may surround the periphery of the light sensing pixel PS. Therefore, the light sensing pixel PS may be surrounded by the first to third display pixels C1 to C3.

According to the embodiments of the present invention, provided are the first to third display pixels that respectively include the organic light emitting materials for displaying the first to third colors, and the display panel that includes the plurality of unit cells including the one light sensing pixel.

Therefore, provided is the display device that performs the display function and the scan function concurrently (e.g., simultaneously), and has a high aperture ratio and high reliability.

The above-disclosed subject matter is to be considered illustrative and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A display device comprising:
a display panel, wherein the display panel comprises:
  a first unit cell comprising:
    at least three display pixels comprising organic light emitting materials to display different colors from each other, each of the at least three display pixels configured to emit different color of lights; and
    a first light sensing pixel adjacent the at least three display pixels, the first light sensing pixel being configured to sense light emission from each of the at least three display pixels of the first unit cell and to generate a first sensing voltage; and
  a second unit cell comprising:
    at least three display pixels comprising organic light emitting materials to display different colors; and
    a second light sensing pixel adjacent the at least three display pixels, the second light sensing pixel being configured to sense light emission from each of the at least three display pixels of the second unit cell and to generate a second sensing voltage;
a display pixel scan driver configured to apply a gate voltage to each of the at least three display pixels;
a display pixel data supplier configured to output data signals to each of the at least three display pixels; and
a sensing pixel scanner different from the display pixel scan driver, and configured to provide sensing voltage control signals to the first and second light sensing pixels to generate the first sensing voltage and the second sensing voltage, respectively, wherein the at least three display pixels of each of the first and second unit cells comprise a first display pixel, a second display pixel, and a third display pixel,
wherein each display pixel of the at least three display pixels of the first and second unit cells comprise a switching device, a storage device and an emitting device,
wherein each emitting device of the at least three display pixels of the first and second unit cells comprise:
  an anode electrode;
  a cathode electrode on the anode electrode; and
  an emission layer between the anode electrode and the cathode electrode, the emission layer comprising one of the organic Eat emitting materials, and
wherein each of the first and second light sensing pixels comprise:
  a transistor;
  a capacitor coupled to the transistor; and
  an optic-electro converter coupled to the capacitor,
wherein the optic-electro converter of the first unit cell is apart from each of the emission layers of the first unit cell in a direction along a plane of the display panel, and wherein the optic-electro converter of the second unit cell is apart from each of the emission layers of the second unit cell in in the direction along the plane of the display panel.

2. The display device of claim 1, wherein the first, second, and third display pixels are provided in plurality, respectively.

3. The display device of claim 2, wherein:
the first and second light sensing pixels are extended in a first direction, and
the first display pixels, the second display pixels, and the third display pixels are arranged in the first direction, respectively.

4. The display device of claim 3, wherein:
the first to third display pixels extended in the first direction configure a display pixel group,
the display pixel group is provided in plurality, and
the display pixel groups are arranged at both sides of the first light sensing pixel and the second light sensing pixel.

5. The display device of claim 1, wherein
the sensing pixel scanner is configured to drive each of the first light sensing pixel and the second light sensing pixel to generate the first sensing voltage and the second sensing voltage.

6. The display device of claim 5,
further comprising a sensing pixel data processor configured to receive the first sensing voltage and the second sensing voltage.

7. The display device of claim 1, wherein one of the first, second, and third display pixels is larger than the other two of the display pixels.

8. The display device of claim 7, wherein the one of the first, second, and third display pixels is configured to display blue.

9. The display device of claim 1, wherein the light sensing pixel is surrounded by the first, second, and third display pixels.

10. The display device of claim 1, wherein the light sensing pixel comprises an optic-electro converter.

11. An operating method of a display device, the operating method comprising:
emitting a first color light from a first display pixel of the display device comprising a plurality of unit cells, wherein the plurality of unit cells comprises:
a first unit cell comprising:
at least three display pixels comprising organic light emitting materials to display different colors; and
a first light sensing pixel adjacent the at least three display pixels, the first light sensing pixel being configured to sense light emission from each of the at least three display pixels of the first unit cell and to generate a first sensing voltage; and
a second unit cell comprising:
at least three display pixels comprising organic light emitting materials to display different colors; and
a second light sensing pixel adjacent the at least three display pixels, the second light sensing pixel being configured to sense light emission from each of the at least three display pixels of the second unit cell and to generate a second sensing voltage,
wherein the at least three display pixels of each of the first and second unit cells comprise the first display pixel, a second display pixel, and a third display pixel;
storing display data in the first display pixel, the second display pixel, and the third display pixel in response to gate voltages applied thereto; and sensing the first color light with the first or second light sensing pixels configured to sense each of a first, second, and third color lights in response to sensing voltage control signals different from the gate voltages, and
wherein each display pixel of the at least three display pixels of the first and the second unit cells comprise a switching device, a storage device and an emitting device,
wherein each emitting device of the at least three display pixels of the first and the second unit cells comprise:
an anode electrode;
a cathode electrode on the anode electrode; and
an emission layer between the anode electrode and the cathode electrode, the emission layer comprising one of the organic light emitting materials, and
wherein each of the first and the second light sensing pixels comprise:
a transistor;
a capacitor connecting to the transistor; and
an optic-electro converter connecting to the capacitor,
wherein the optic-electro converter of the first unit cell is apart from each of the emission layers of the first unit cell in a direction along a plane of a display panel, and
wherein the optic-electro converter of the second unit cell is apart from each of the emission layers of the second unit cell in the direction along the plane of the display panel.

12. The operating method of claim 11, further comprising:
emitting the second color light from the second display pixel, after sensing the first color light;
sensing the second color light with the first or second light sensing pixels;
emitting the third color light from the third display pixel, after sensing the second color light; and
sensing the third color light with the first or second light sensing pixels.

13. The operating method of claim 12, further comprising displaying the sensed first, second, and third color lights on the first, second, and third display pixels, respectively, after sensing the third color light.

14. The operating method of claim 11, wherein the second and third display pixels do not emit the second and third color lights while the first display pixel is emitting the first color light.

15. The operating method of claim 11, further comprising arranging a scanned object on the display device before emitting of the first display pixel,
wherein the sensing of the first color light comprises sensing a light reflected from the scanned object.

16. The operating method of claim 15, wherein:
the display device further comprises a sensing data processor coupled to the first and second light sensing pixels,
the first and second light sensing pixels comprise an optic-electro converter, and
the sensing the reflected light comprises:
generating the first and second sensing voltages by the reflected light being inputted to the optic-electro converter; and
transferring the first and second sensing voltages to the sensing data processor.

17. The operating method of claim 16, wherein the first display pixel does not emit the first color light while the first or second sensing voltages are being transferred to the sensing data processor.

18. The operating method of claim 11, wherein the second and third display pixels emit the second and third color lights while the first display pixel is emitting light.

19. The operating method of claim 18, wherein the first or second light sensing pixel senses the first, second, and third color lights.

* * * * *